(12) United States Patent
Callahan, Jr.

(10) Patent No.: US 6,583,651 B1
(45) Date of Patent: Jun. 24, 2003

(54) NEURAL NETWORK OUTPUT SENSING AND DECISION CIRCUIT AND METHOD

(75) Inventor: Michael J. Callahan, Jr., Austin, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 0 days.

(21) Appl. No.: 10/013,215

(22) Filed: Dec. 7, 2001

(51) Int. Cl.⁷ .................................................. H03K 5/22
(52) U.S. Cl. .......................................... 327/64; 327/99
(58) Field of Search ........................ 327/50, 58, 62–64, 327/69, 71, 82, 99

(56) References Cited

U.S. PATENT DOCUMENTS

| | | | |
|---|---|---|---|
| 5,408,194 A | * | 4/1995 | Steinbach et al. ............. 327/62 |
| 5,905,387 A | | 5/1999 | Chinosi et al. ................ 327/62 |
| 6,032,140 A | | 2/2000 | Fabbrizio et al. ............. 706/15 |

OTHER PUBLICATIONS

Lazzaro, J. et al., "Winner–Take–All Networks of O(N) Complexity," *Neural Inform Proc. Syst.*, vol. 1, pp. 703–711, Denver, CO, 1989.

Smedley, S. et al., "A Scalable High–Speed Current–Mode Winner–Take–All Network for VLSI Neural Applications," *IEEE Trans. on Circuits and Systems–I: Fundamental Theory and Applications*, 42(5), 1995.

McCreary, J. et al., "NMOS Comparator for a Bubble Memory," in *Proceedings of the IEEE International Solid–State Circuits Conference*, Session XIV: Analog Techniques, Feb. 19, 1981, pp. 184–185, 271.

* cited by examiner

Primary Examiner—Kenneth B. Wells
(74) Attorney, Agent, or Firm—David V. Carlson; Lisa K. Jorgenson

(57) ABSTRACT

A device and method for selecting within a group of analog signals the one with the lowest or with the highest value. In one embodiment the device has a differential amplifier configuration having an input to receive a comparison signal, a plurality of inputs to receive analog signals and a corresponding plurality of outputs to provide digital voltage signals. This device also has at least one logic circuit having a plurality of input terminals, each connected to a corresponding output of the differential amplifier configuration, and having at least one output terminal.

24 Claims, 5 Drawing Sheets

NEURAL NETWORK OUTPUT SENSING AND DECISION CIRCUIT AND METHOD

BACKGROUND OF THE INVENTION

1. Field of the Invention

The present invention relates generally to neural network output selector devices, and more specifically to a device and method for selecting within a group of analog signals the one with the lowest or with the highest value.

2. Description of the Related Art

As known, the majority of these devices, which are known in the literature as "Winner Take All" (WTA) circuits or as "Loser Take All" (LTA) circuits, are provided by means of architectures which exhibit a voltage-follower configuration and make use of inhibitor mechanisms operating among the calculation elements included in them.

A first known technical solution is described in the article "Winner Take All Networks of O(N) Complexity," J. Lazzaro et al., *Neural Inform Proc. Syst.* 1:703–711, Denver, Colo., 1989, and calls for the use of a selector device comprising a plurality of circuit branches operating in parallel and each including a first voltage follower transistor T1$i$ and a second local positive feedback transistor T2$i$, where i=1, . . . j, . . . n. The device also comprises a total feedback line LN common to all the circuit branches. Operation of the selector device is as follows. Each circuit branch receives the input of a one-way current Ii and supplies output of a voltage Vi which represents the result of the selection process. When the current Ii=max (I1, . . . In), the voltage Vi coincides with a logarithmic function of Ii, and if the current Ij<<Ii, the voltage Vj~0. Although advantageous in some ways, this first solution exhibits diverse shortcomings. Indeed, the device does not provide any offset compensation and has a calculation time which depends on the number of elements making it up.

A second known technical solution is described in the article "A Scalable High-Speed Current-Mode Winner Take All Network for VLSI Neural Applications," Sean Smedley et al., *IEEE Transactions on Circuits and Systems*-I: *Fundamental Theory and Applications* 42(5), 1995 which proposes a tree-structured circuit comprising a plurality of cells provided by using bipolar transistors integrated with a BICMOS technology. Each cell receives at input two current signals I1 and I2 which are compared with each other to select the highest one. The latter represents the input for a cell included in a subsequent layer of the tree structure and so on until there is obtained at output the higher input current signal.

A third technical solution is disclosed in U.S. Pat. No. 5,905,387 ("the '387 patent") issued on May 18, 1999, to Chinosi, et al, and entitled "ANALOG VOLTAGE-SIGNAL SELECTOR DEVICE", the disclosure of which is incorporated herein by reference. Chinosi's approach has significant advantages in speed and flexibility. A circuit which has improved speed and power consumption characteristics beyond those of the '387 patent is preferred.

BRIEF SUMMARY OF THE INVENTION

In accordance with one aspect of the present invention, the output-selector employs a differential amplifier configuration with a plurality of analog voltage inputs and an analog comparison voltage input. The output selector also employs a logic circuit. The output-selector determines which of the plurality of analog input voltages has the lowest potential. In another aspect of the present invention, the output-selector determines which of the plurality of analog input voltages has the highest potential.

DETAILED DESCRIPTION OF THE INVENTION

The present invention provides for low power consumption, high reliability, and a non-complicated device and method for selecting from a plurality of analog input signals the signal with the lowest or highest value. The invention is particularly useful as an output-selector for a neural network, the outputs of the neural network representing corresponding inputs to the output-selector. Although the examples presented herein are based on analog input voltages, the present invention can be figured to read data in various forms such as a conductance, an impedance, an analog current or some other acceptable input.

Figure 1:
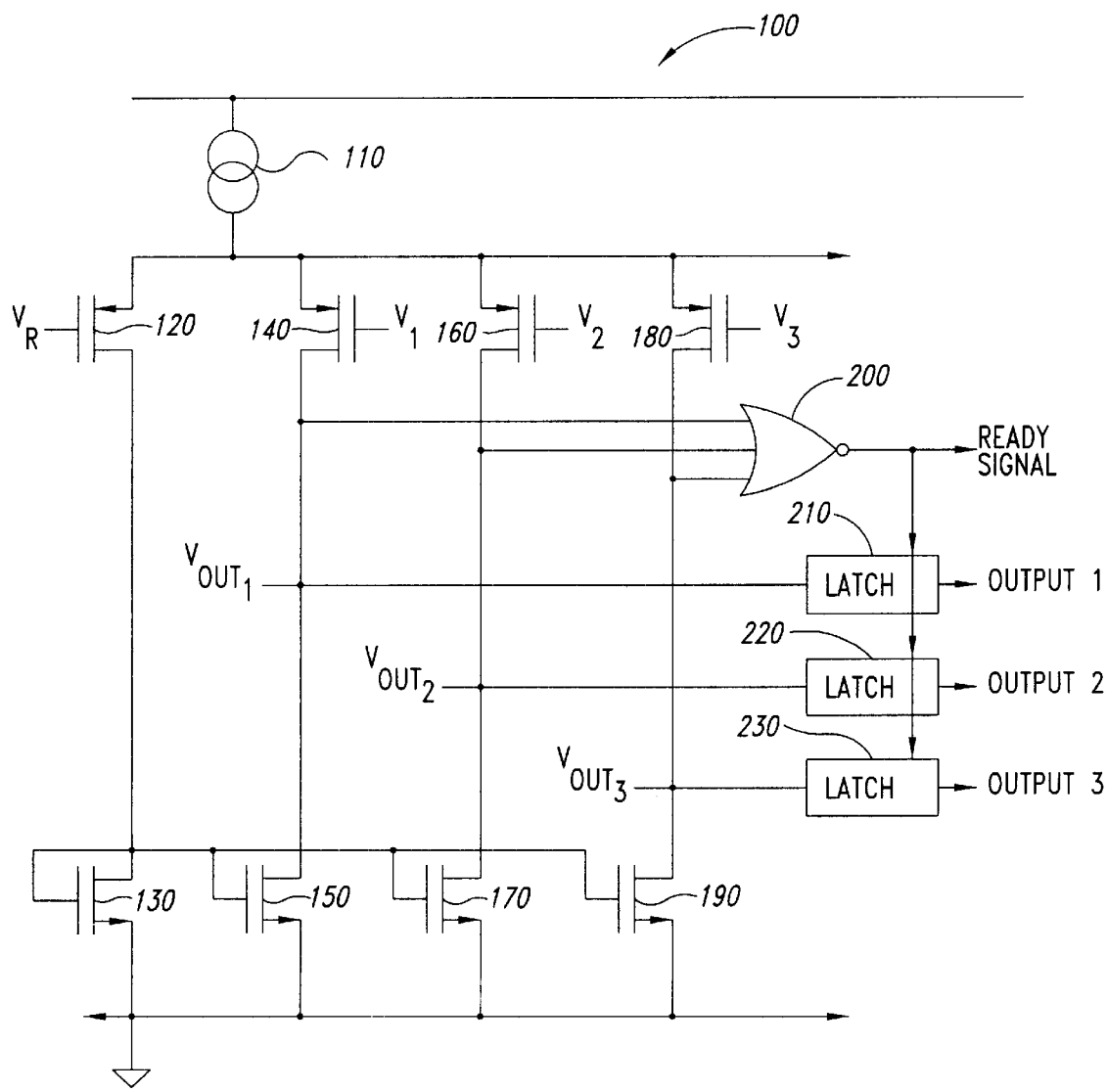
FIG. 1 shows a block diagram of an output-selector device provided in accordance with the present invention.

The present invention is embodied in a device 100 illustrated in the functional block of FIG. 1. The device 100 as illustrated in FIG. 1 determines which of three analog voltage inputs is the lowest. The device 100 includes a current source 110. A p-channel input differential amplifier circuit is formed by transistors 120, 130, 140, and 150. The inputs to this circuit are $V_R$, a comparison voltage, and $V_1$, one of the analog input voltages. A second p-channel input differential amplifier circuit is formed by transistors 120, 130, 160, and 170, and a third p-channel input differential amplifier circuit is formed by transistors 120, 130, 180 and 190. The inputs to the second p-channel differential amplifier circuit are $V_R$ and $V_2$, a second analog input voltage. The output is $V_{OUT2}$. The inputs to the third p-channel differential amplifier circuit are $V_R$ and $V_3$, a third analog input voltage. The output is $V_{OUT3}$. Transistors 120, 140, 160 and 180 are p-channel transistors and transistors 130, 150, 170 and 180 are n-channel transistors.

Thus, the device 100 utilizes a multi-stage differential amplifier configuration comprised of a comparison input stage which receives a comparison voltage as its input and a plurality of analog signal input stages wherein each analog signal input stage receives one of the analog voltage signals as its input. The output voltage, $V_{OUTi}$, of each differential amplifier stage in the differential amplifier configuration will be low when the analog input voltage to that stage, $V_i$, is greater than the comparison voltage, $V_R$. Conversely, the output voltage, $V_{OUTi}$, of each differential amplifier stage in the differential amplifier configuration will be high when the analog input voltage to that stage, $V_i$, is less than the comparison voltage, $V_R$.

The device 100 also contains a NOR gate 200, which receives as inputs $V_{OUT1}$, $V_{OUT2}$ and $V_{OUT3}$. Latches 210, 220 and 230 receive as inputs $V_{OUT1}$, $V_{OUT2}$ and $V_{OUT3}$, respectively. Latches 210, 220, and 230 also receive the output of NOR gate 200 as a control signal.

Additional analog signal inputs can be accommodated by adding additional analog signal input stages to the differential amplifier configuration, increasing the number of inputs to the NOR gate 200, and adding additional latches. The differential amplifier configuration need not share a common comparison input stage. The use of a common comparison input stage, however, significantly reduces the number of individual components required in the differential amplifier configuration.

The operation of device 100 as illustrated in FIG. 1 to select the lowest of three analog input voltages when the differential gain of each differential amplifier stage is positive may be described as follows. A ramp voltage, $V_R$, with a positive slope is applied to the gate of transistor 120. The initial voltage of $V_R$ is less than the lowest analog input voltage. Thus, each of the outputs $V_{OUTi}$ will be low. The output of the NOR gate 200 will be high. As $V_R$ increases it will eventually exceed the value of the lowest of the analog input voltages. This will trigger a swing in the corresponding output voltage from low to high and a swing in the output of the NOR gate 200 from high to low. This in turn will trigger the latches to store the output voltages $V_{OUTi}$. The output corresponding to the lowest of the analog input voltages will be high and the output voltages corresponding to the other two analog input voltages will be low. The output of the NOR gate 200 can also be used to signal that the calculation is finished. In the context of a neural recognition network, the output of the NOR gate 200 can be used to signal that a match has been detected.

Figure 2:
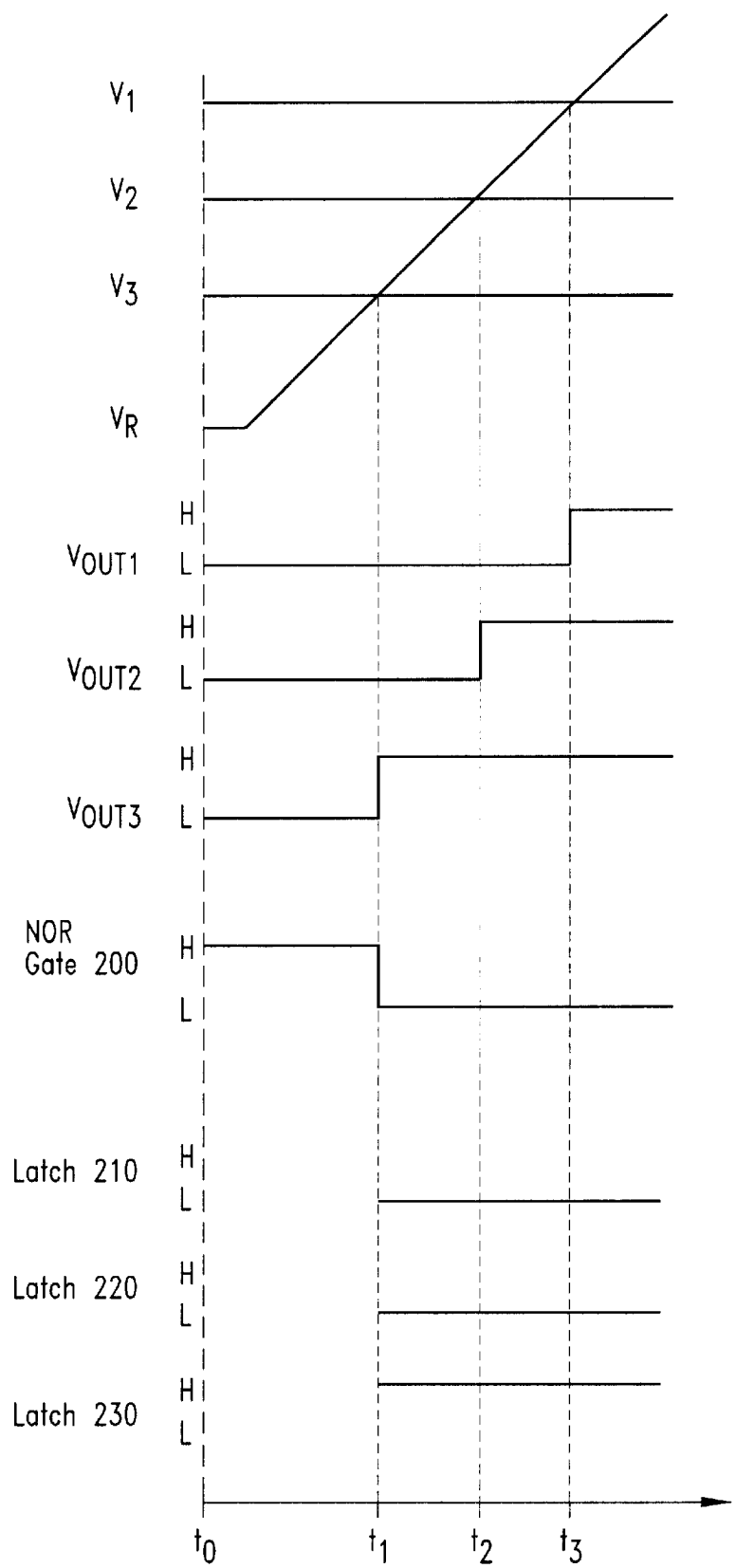
FIG. 2 shows charts, with the same time base, of example electrical signals present in the device of FIG. 1.

FIG. 2 shows charts, with the same time base, of example electrical signals present in the device of FIG. 1. Which ever is the lower of the input voltage $V_1$, $V_2$, $V_3$ Will cause the NOR gate 200 to change state and thus capture the one which caused it to trigger as the lowest of the voltages and store the other two as being higher in value.

In the specific example of FIG. 2, the analog voltage input $V_3$ is shown having the lowest voltage level. At time $t_0$, $V_R$ is less than $V_3$. At time $t_1$, when $V_R$ exceeds $V_3$, $V_{OUT3}$ will swing from low to high. This will cause the output of the NOR gate 200 to swing from high to low, after a brief transition time-delay, which will in turn cause the latches 210, 220, and 230 to store, respectively, $V_{OUT1}$, $V_{OUT2}$, and $V_{OUT3}$, where $V_{OUT1}$ and $V_{OUT2}$ are low and $V_{OUT3}$ is high. The output of latches 210 and 220 will be low and the output of latch 230 will be high. At time $t_2$, $V_R$ will exceed $V_2$ and $V_{OUT2}$ will swing from low to high. The output of latch 220, however, will remain low. Similarly, at time $t_3$, $V_R$ will exceed $V_1$ and $V_{OUT1}$ will swing from low to high. The output of latch 210, however, will remain low. As previously stated, if $V_2$ had been lower than $V_3$, it is the one which would have caused the NOR gate 200 to switch and thus would have been stored in its respective latch 220 as the lowest, namely the winner.

Figure 3:
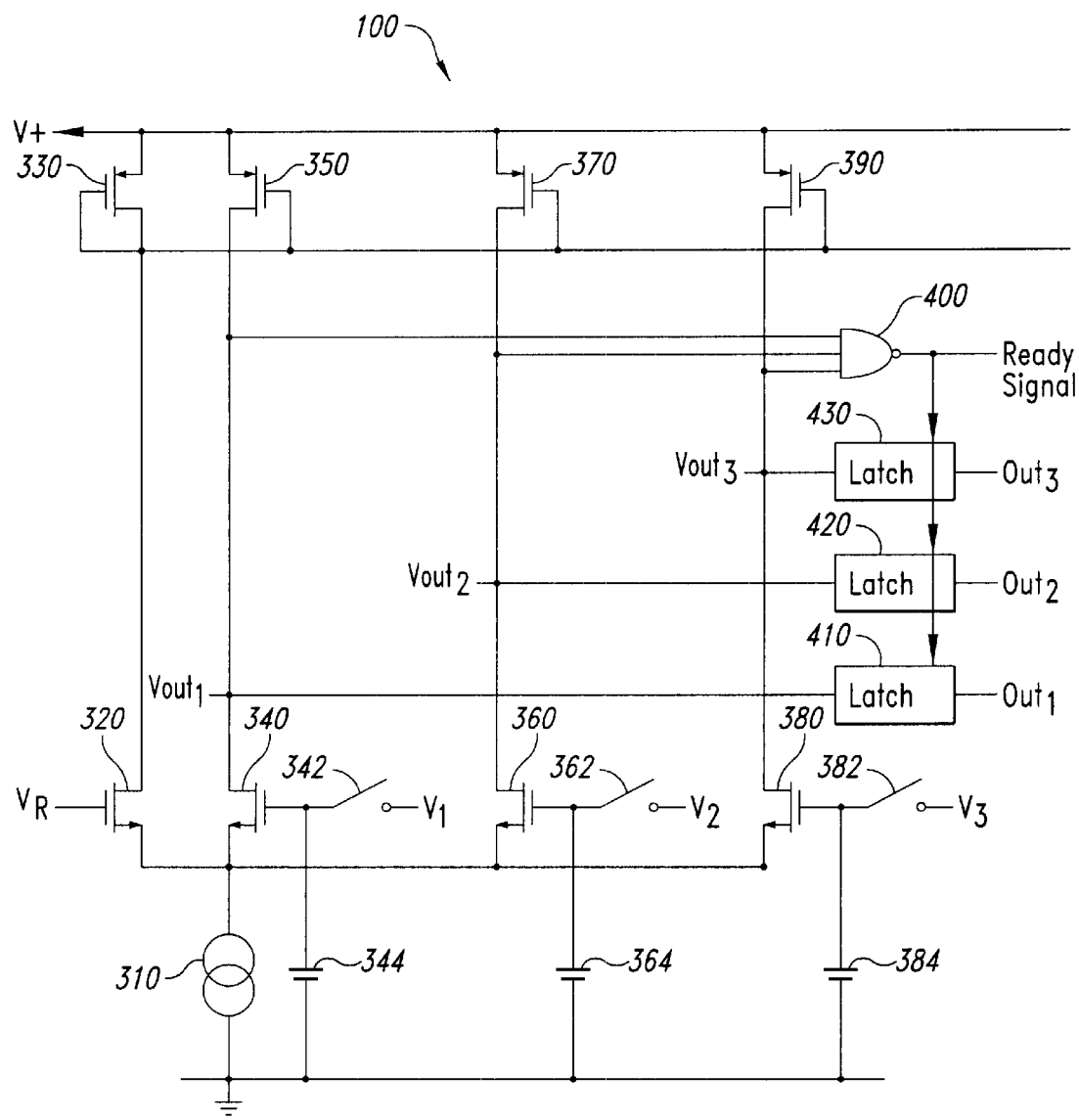
FIG. 3 shows a block diagram of an output-selector device provided in accordance with the present invention.

An alternative embodiment of the device 100 is illustrated in the functional block of FIG. 3. This embodiment employs sampling of the analog input signals, which may be desired if there is a need to eliminate offset voltages or if the phase of the input signals is important. In the event there are phase differences in the input voltages, the sample circuit arrangement may ensure that all signals are held in the same phase as each other during the comparison step, so that an accurate comparison can occur.

Auto-zeroing of offsets for sampled-data MOS circuits is well known. See, for example, James McCreary, et al., *NMOS Comparator for a Bubble Memory* (1981), which uses a series capacitor to store an offset voltage in one clock phase, then uses the stored offset to cancel the inherent offset of the differential amplifier in another clock phase. A similar approach is shown in FIG. 2 of the '387 patent.

Although FIG. 3 utilizes switches and capacitors, various equivalent methods of sampling signals may be employed. In one embodiment, the inputs to the circuit of FIG. 3 are not sampled, but are provided as direct inputs. Conversely, the inputs to the circuit of FIG. 1 in one embodiment have sampling switches coupled to the input signals.

The device 100 as illustrated in FIG. 3 determines which of three analog voltage inputs is the highest. The device 100 includes a current source 310. An n-channel input differential amplifier circuit is formed by transistors 320, 330, 340, and 350. The first input to this circuit is $V_R$, a comparison voltage. The second input is a sample of $V_1$, one of the analog input voltages. The sample is taken by closing switch 342 and storing a voltage on capacitor 344, which equals $V_1$. A second n-channel input differential amplifier circuit is formed by transistors 320, 330, 360, and 370, and a third n-channel input differential amplifier circuit is formed by transistors 320, 330, 380 and 390. The inputs to the second n-channel differential amplifier circuit are $V_R$ and a sample of $V_2$, a second analog input voltage. The sample of $V_2$ is taken by closing switch 362 and storing a voltage on capacitor 364, which is equal to $V_2$. The output of the second differential amplifier circuit is $V_{OUT2}$. The inputs to the third n-channel differential amplifier circuit are $V_R$ and a sample of $V_3$, a third analog input voltage. The sample of $V_3$ is collected by closing switch 382 and storing a voltage on capacitor 384. The output is $V_{OUT3}$. Transistors 320, 340, 360 and 380 are n-channel transistors and transistors 330, 350, 370 and 380 are p-channel transistors.

Thus, the device 100 as illustrated in FIG. 3 utilizes a multi-stage differential amplifier configuration comprised of a comparison input stage which receives a comparison voltage as its input and a plurality of analog signal input stages wherein each analog signal input stage receives a sample of one of the analog voltage signals as its input. The output voltage, $V_{OUTi}$, of each differential amplifier stage in the differential amplifier configuration will be high when the analog input voltage sample to that stage, $V_{i\text{-}sample}$, is greater than the comparison voltage, $V_R$. Conversely, the output voltage, $V_{OUTi}$, of each differential amplifier stage in the differential amplifier configuration will be low when the analog input voltage to that stage, $V_{i\text{-}sample}$, is less than the comparison voltage, $V_R$.

The device 100 as illustrated in FIG. 3 also contains a NAND gate 400, which receives as inputs $V_{OUT1}$, $V_{OUT2}$ and $V_{OUT3}$, and latches 410, 420 and 430, which receive as inputs $V_{OUT1}$, $V_{OUT2}$ and $V_{OUT3}$, respectively. Latches 410, 420, and 430 also receive the output of NAND gate 400 as a control signal or enable signal.

Additional analog signal inputs can be accommodated by adding additional analog signal input stages to the differential amplifier configuration, increasing the number of inputs to the NAND gate 400, and adding additional latches. The differential amplifier configuration need not share a common comparison input stage. The use of a common comparison input stage, however, significantly reduces the number of individual components required in the differential amplifier configuration.

The operation of device 100 as illustrated in FIG. 3 to select the highest of three analog input voltages when the differential gain of each differential amplifier stage is positive may be described as follows. Each of the analog input voltages $V_i$ is sampled. A ramp voltage, $V_R$, with a negative slope is applied to the gate of transistor 320. The initial voltage of $V_R$ is higher than the highest analog input voltage sample. Thus, each of the outputs $V_{OUTi}$ will be high. The output of the NAND gate 400 will be low. As $V_R$ decreases it will eventually fall below the value of the highest of the analog input voltage samples. This will trigger a swing in the corresponding output voltage from high to low and a swing in the output of the NAND gate 400 from low to high. This in turn will trigger the latches to store the output voltages $V_{OUTi}$. The output corresponding to the highest of the analog input voltage samples will be low and the output voltages corresponding to the other two analog input voltage samples will be high. The output of the NAND gate 400 can also be used to signal that the calculation is finished. In the context of a neural recognition network, the output of the NAND gate 400 can be used to signal that a match has been detected.

Figure 4:
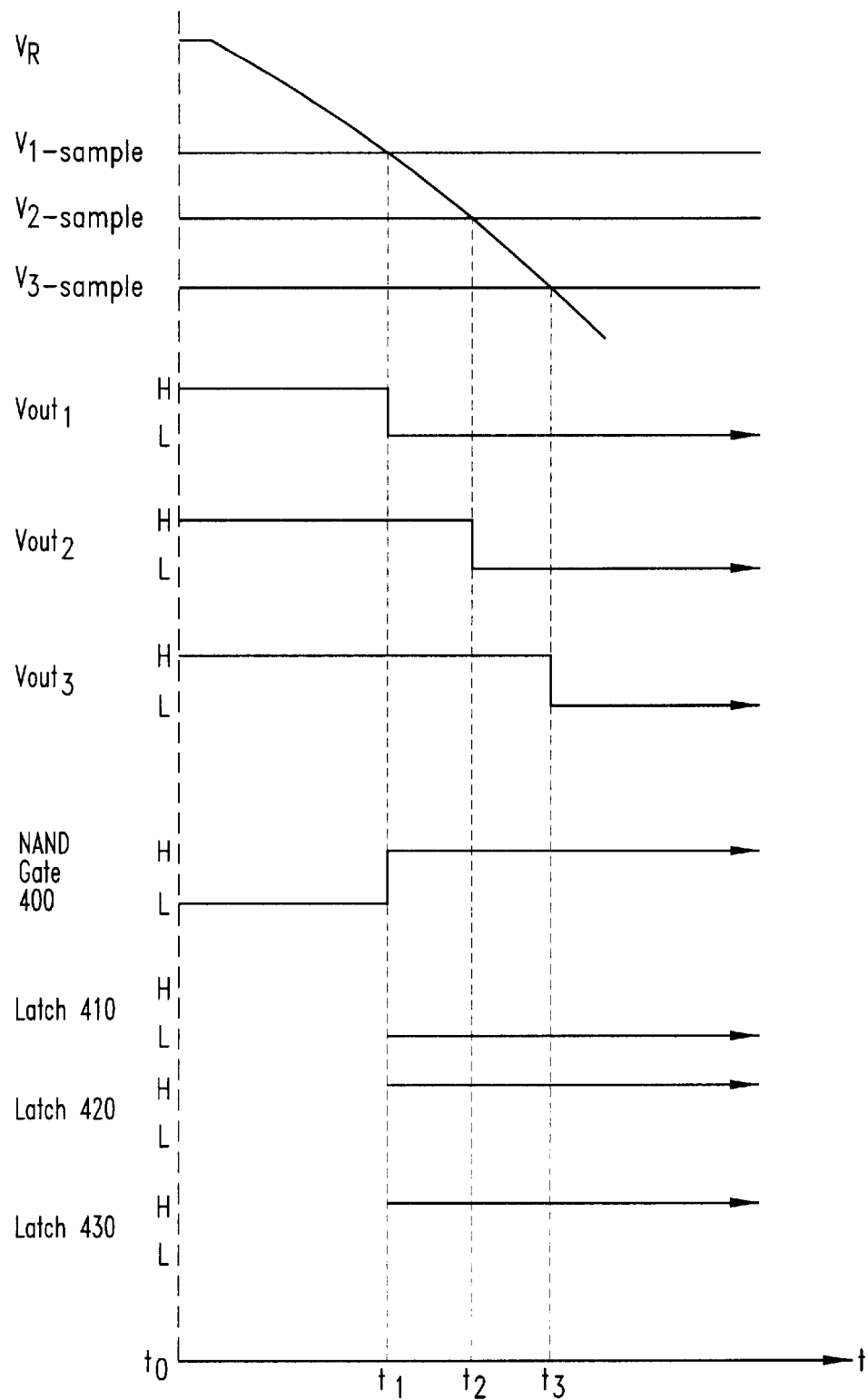
FIG. 4 shows charts, with the same time base, of example electrical signals present in the device of FIG. 3.

FIG. 4 shows charts, with the same time base, of example electrical signals present in the device of FIG. 3. In FIG. 4, the analog voltage input sample $V_{i\text{-}sample}$ has the highest voltage level. At time $t_0$, $V_R$ exceeds $V_{i\text{-}sample}$. When $V_R$ drops below $V_{i\text{-}sample}$ at time $t_1$, $V_{OUT1}$ will swing from high to low. This will cause the output of the NAND gate 400 to swing from low to high, after a brief transition time-delay, which will in turn cause latches 410, 420, and 430 to store, respectively, $V_{OUT1}$, $V_{OUT2}$, and $V_{OUT3}$, where $V_{OUT2}$ and $V_{OUT3}$ are high and $V_{OUT1}$ is low. The output of latches 420 and 430 will be high and the output of latch 410 will be low.

Multiple examples of differential amplifier configurations have been presented herein for purposes of illustration. Additional differential amplifier configurations that are considered equivalent may be utilized, including configurations which are not based on CMOS technology as well as additional configurations based on CMOS technology. One of skill in the art will also recognize that the relationship between the analog inputs and their corresponding outputs need not be inverse. Further, having various circuit components, including buffers, inverters or other circuit elements positioned at various locations in the circuit to achieve the same result is considered an equivalent circuit.

Logic circuits other than NOR and NAND gates may be employed and the latches may be active high or active low. Thus, the present invention can be configured to produce either a single WTA or LTA result, or an output vector which at each instant represents the outputs $V_{OUTi}$ that have been activated up until that moment in time.

In one embodiment, the device 100 may be used with an electronic classification system CLASS. The CLASS comprises a plurality of input terminals designed to receive strings of digital signals SDi with, e.g., i=1,2, and a plurality of output terminals.

This CLASS system also includes an associative memory MA comprising groups of memory blocks SRAM/XNOR connected together through respective input terminals leading to an input terminal of the CLASS system and each having an output connected to a same output of the membership group.

The memory MA makes a comparison between strings of digital reference signals stored therein and the digital input signal SDi strings. For example, each of the memory blocks in the first group compares a component of the input vector SD1 with a stored value in the respective SRAM/XNOR circuit and then outputs a current on the node that is representative of the comparison. In one aspect of the invention, if the compared component of the vector SD1 and the value stored in the associated memory block SRAM/XNOR are equal, the memory block sinks a current from a node, and if the vector component and stored value are not equal, the memory block neither sinks nor sources a current to the node.

The classification system CLASS also incorporates a plurality of adding circuits SUMi each having an output terminal and at least one first input terminal connected to an output of a corresponding group of the associative memory MA and a second input terminal connected to a fixed voltage reference GND. Thus, each adding circuit SUMi converts the sum of the currents generated by the memory blocks in a corresponding group into a voltage at the output of the circuit SUMi. In one aspect of the invention, the circuits SUMi each include an operational amplifier that has its noninverting input terminal coupled to ground and its inverting input terminal coupled to the common output of the associated group of memory blocks. A feedback impedance Ii is coupled between the inverting input terminal and the output of the operational amplifier.

Finally, the system CLASS comprises a selector device 100 that has its input terminals respectively coupled to the output terminals of the circuits SUMi. The outputs of the selector device 100 provide the output terminals of the CLASS system.

In the application described here, the device 100 selects the memorized digital signal string corresponding to the input digital signal string on the basis of a relationship implemented in the memory MA. Specifically, in a Winner Take All embodiment, the device 100 identifies which of the circuits SUMi generates the highest output voltage, and thus which group of memory blocks SRAM/XNOR sinks the largest total current from the common output node that is connected to the input of the SUMi circuit. The group that generates the highest current is the one that finds the most matches between the values stored in the memory blocks SRAM/XNOR and the corresponding components of the input digital vector SDi. For example, suppose there are ten blocks SRAM/XNOR in each group, and that each vector SDi includes ten corresponding components. Furthermore, assume that out of the ten possible matches between the ten values stored in the memory blocks SRAM/XNOR and the ten components of the vectors SDi, there are eight matches between the components of SD1 and the corresponding group, four matches between the components of SD2 and its corresponding group, and two matches between the components of SD3 and its corresponding group. Therefore, the group corresponding to SD1 would sink a greater current than the groups corresponding to SD2 and SD3 respectively, and thus SUM1 would generate a greater output voltage than SUM2 and SUM3. The selector device 100 would then identify that SUM1 had the higher input voltage. One could then read this data and determine that there were more matches with SD1 than there were with SD2 or SD3.

Figure 5:
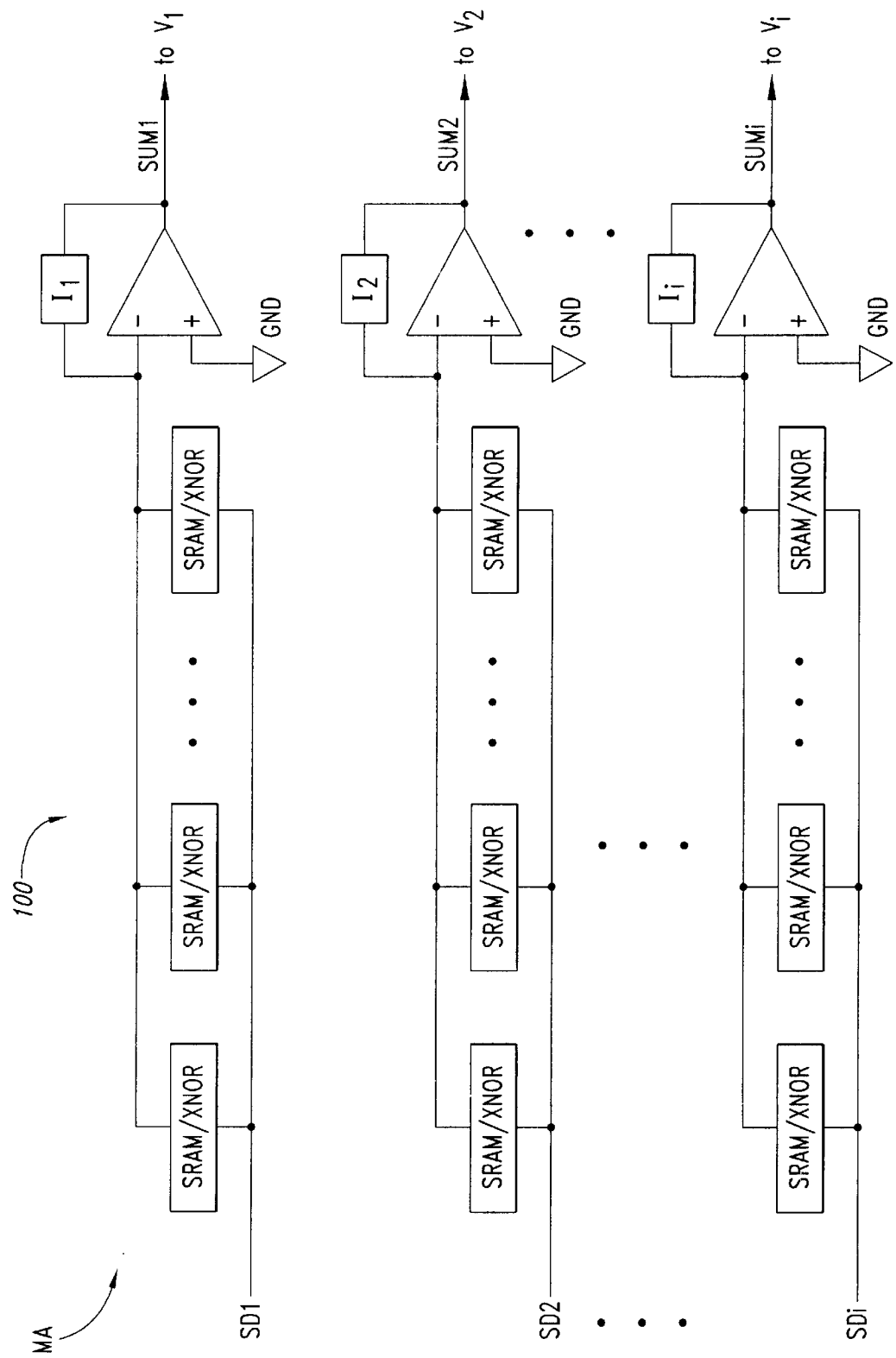
FIG. 5 shows a possible circuit application of the selector-device in accordance with the present invention.

The CLASS system of FIG. 5 can be used in analog associative memories for pattern recognition as well as in associative memories in general. For example, the CLASS system can be used in an optical character recognition (OCR) system, or for simple motion control functions in robotics. The CLASS system can also be used in personal digital assistants (PDA). For example, where the CLASS system is part of an OCR system, the CLASS circuit receives at all of its inputs a vector SD that represents a character. The CLASS circuit also stores in the memory MA a database of characters. The vector SD is then compared with each of the characters that are stored in the groups of memory blocks SRAM/XNOR. Each of the groups generates at its common output node a current that is proportional to the number of matches between the stored values and the components of the vector SD. The WTA circuit 100 then determines which of the currents is the greatest, i.e., which of the stored characters has the most component matches with the vector SD, and thus which character the vector SD represents. The vector SD is then coded into the recognized character by circuitry that is not shown here for clarity.

In one preferred embodiment, the MA is composed of non-volatile memory cells, each storing an analog voltage, rather than being composed of an SRAM, an XNOR circuit or some other device. The non-volatile memory cell may, for example, be of the multilevel type capable of storing many different discrete voltage levels, such as between 4 and 128 different voltage levels. The input signal Sdi will thus be compared to the respective stored analog values, thus permitting memory MA to truly mimic a neural network. In a further preferred embodiment, the MA stores values in the form of a conductance of some digital or analog value. The use of a conductance as the stored value provides very high speed sensing with low power consumption. See, for example, U.S. Pat. No. 6,032,140, issued to Fabbrizio, et al.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A device for identifying a selected signal from a plurality of input signals, the device comprising:
    a comparison input terminal to receive a comparison signal;
    a plurality of differential amplifier circuits to compare the comparison signal to each of the plurality of input signals and having a plurality of output terminals;
    a logic circuit comprising a plurality of logic input terminals and a logic output terminal, wherein each logic input terminal is coupled to one of the plurality of output terminals of the differential amplifier circuits; and
    a plurality of latches each having an output terminal, an input terminal coupled to one of the plurality of output terminals of the differential amplifier circuits, and an enable terminal coupled to the logic output terminal.

2. The device of claim 1 wherein the plurality of differential amplifier circuits have a common comparison input stage.

3. The device of claim 1 wherein the logic circuit comprises a NOR gate having input terminals that are each coupled to one of the logic input terminals and having an output terminal that is coupled to the logic output terminal.

4. The device of claim 1 wherein the logic circuit comprises a NAND gate having input terminals that are each coupled to one of the logic input terminals and having an output terminal that is coupled to the logic output terminal.

5. The device of claim 1 wherein the plurality of latches are active-low enable.

6. The device of claim 1 wherein the plurality of latches are active-high enable.

7. The device of claim 1 wherein each of the plurality of differential amplifier circuits further comprises a memory to store information based on a characteristic of one of the plurality of input signals.

8. The device of claim 7 wherein the memory comprises a capacitor and a switch.

9. The device of claim 1 wherein the plurality of differential amplifier circuits are comprised of CMOS, p-channel input differential amplifier circuits.

10. The device of claim 1 wherein the plurality of differential amplifier circuits are comprised of CMOS, n-channel input differential amplifier circuits.

11. The device of claim 1, wherein the plurality of input signals are analog voltage signals.

12. An analog voltage signal selector device comprising:
    an input terminal to receive a comparison voltage signal;
    a plurality of differential amplifier circuits to compare the comparison voltage signal to a plurality of analog voltage signals, and having a plurality of output terminals;
    a logic circuit comprising a plurality of logic input terminals and a logic output terminal, wherein each logic input terminal is coupled to one of the plurality of output terminals of the plurality of differential amplifier circuits; and
    a plurality of latches each having an output terminal, an input terminal coupled to the output terminal of one of the plurality of differential amplifier circuits, and an enable terminal coupled to the logic output terminal.

13. The device of claim 12 wherein the plurality of differential amplifier circuits have a common comparison input stage.

14. An analog voltage signal selector device comprising:
    a differential amplifier circuit comprising a comparison voltage input terminal to receive a comparison voltage, a plurality of analog voltage input terminals to receive a plurality of analog voltages, and a plurality of output terminals;
    a logic circuit comprising a plurality of logic input terminals and a logic output terminal, wherein each logic input terminal is coupled to one of the differential amplifier circuit output terminals; and
    a plurality of latches each having an output terminal, an input terminal coupled to one of the differential amplifier circuit output terminals, and an enable terminal coupled to the logic output terminal.

15. The device of claim 14 wherein the logic circuit comprises a NOR gate having input terminals that are each coupled to one of the logic input terminals and having an output terminal that is coupled to the logic output terminal.

16. The device of claim 15 wherein each of the analog voltage input terminals is coupled to a memory.

17. The device of claim 15 wherein the differential amplifier circuit is a CMOS input differential amplifier circuit.

18. A method for identifying from a plurality of analog voltage signals the largest-magnitude voltage signal, the method comprising:
    generating a comparison signal with a non-zero slope and an initial magnitude greater than the magnitude of each of the plurality of analog voltage signals;
    comparing the comparison signal to each of the plurality of analog voltage signals by differentially amplifying a difference between the comparison signal and the analog voltage signal to which the comparison signal is being compared; and
    detecting when the comparison signal first becomes lower in magnitude than one of the plurality of analog voltage signals.

19. The method of claim 18, wherein the comparison signal has a positive slope.

20. A method for identifying from a plurality of analog voltage signals the smallest-magnitude voltage signal, the method comprising:

generating a comparison signal with a non-zero slope and an initial magnitude smaller than the magnitude of each of the plurality of analog voltage signals;

comparing the comparison signal to each of the plurality of analog voltage signals by differentially amplifying a difference between the comparison signal and the analog voltage signal to which the comparison signal is being compared; and detecting when the comparison signal first becomes greater in magnitude than one of the plurality of analog voltage signals.

21. The method of claim 20, wherein the comparison signal has a negative slope.

22. An electronic classification system comprising:

a plurality of input terminals to receive a plurality of inputs;

a plurality of associative memories each coupled to one of the plurality of inputs, each associative memory having an output terminal;

a comparison input terminal to receive a comparison signal;

a plurality of differential amplifier circuits, each coupled to the comparison input terminal and coupled to the output terminal of one of the plurality of associative memories, and each having an output terminal;

a logic circuit comprising a plurality of logic input terminals and a logic output terminal, wherein each logic input terminal is coupled to the output terminal of one of the plurality of differential amplifier circuits; and a plurality of latches each having an output terminal, an input terminal coupled to the output of one of the differential amplifier circuits, and an enable terminal coupled to the logic output terminal.

23. An electronic classification system comprising:

a plurality of input terminals to receive a plurality of inputs;

a plurality of associative memories each coupled to one of the plurality of input terminals and having an output terminal;

an comparison input terminal to receive a comparison voltage signal;

a plurality of differential amplifier circuits each coupled to the comparison input terminal and coupled to the output terminal of one of the plurality associative memories and having an output terminal;

a logic circuit comprising a plurality of logic input terminals and a logic output terminal, wherein each logic input terminal is coupled to the output terminal of one of the plurality of differential amplifier circuits; and a plurality of latches each having an output terminal, an input terminal coupled to the output terminal of one of the plurality of differential amplifier circuits, and an enable terminal coupled to the logic output terminal.

24. An electronic classification system comprising:

a plurality of input terminals to receive a plurality of inputs;

a plurality of associative memories coupled to the plurality of inputs, each associative memory having an analog voltage output;

a differential amplifier circuit comprising a comparison voltage input terminal to receive a comparison voltage; a plurality of analog voltage input terminals to receive the plurality of analog voltage outputs; and a plurality of output terminals;

a logic circuit comprising a plurality of logic input terminals and a logic output terminal, wherein each logic input terminal is coupled to one of the differential amplifier circuit output terminals; and a plurality of latches each having an output terminal, an input terminal coupled to one of the differential amplifier circuit output terminals, and an enable terminal coupled to the logic output terminal.

* * * * *